(12) United States Patent
Kagaya et al.

(10) Patent No.: US 8,218,973 B2
(45) Date of Patent: Jul. 10, 2012

(54) OPTICAL TRANSMITTER DEVICE AND OPTICAL TRANSMITTER MODULE

(75) Inventors: Osamu Kagaya, Tokyo (JP); Satoshi Motohiro, Yokohama (JP); Masahiro Hirai, Yokohama (JP)

(73) Assignee: Opnext Japan, Inc., Yokohama-shi (JP)

( * ) Notice: Subject to any disclaimer, the term of this patent is extended or adjusted under 35 U.S.C. 154(b) by 346 days.

(21) Appl. No.: 12/626,033

(22) Filed: Nov. 25, 2009

(65) Prior Publication Data
US 2010/0232806 A1 Sep. 16, 2010

(30) Foreign Application Priority Data
Mar. 16, 2009 (JP) .................................. 2009-062367

(51) Int. Cl.
*H04B 10/04* (2006.01)
(52) U.S. Cl. ........ 398/182; 398/183; 398/197; 398/198; 398/164
(58) Field of Classification Search .................. 398/182, 398/183, 197, 198, 164
See application file for complete search history.

(56) References Cited

U.S. PATENT DOCUMENTS

| | | | | |
|---|---|---|---|---|
| 4,616,571 A * | 10/1986 | Lange | ............................... | 108/60 |
| 5,182,756 A * | 1/1993 | Waki et al. | .................. | 372/38.02 |
| 5,608,561 A * | 3/1997 | Marcuse et al. | ............... | 398/192 |
| 5,706,117 A * | 1/1998 | Imai et al. | ...................... | 398/197 |
| 6,697,405 B2 | 2/2004 | Kitatani et al. | | |
| 6,746,938 B2 | 6/2004 | Uchiyama et al. | | |
| 6,821,801 B1 | 11/2004 | Sato et al. | | |
| 6,836,350 B2 * | 12/2004 | Singh et al. | .................... | 359/240 |
| 6,836,492 B2 * | 12/2004 | Ido et al. | .......................... | 372/36 |
| 6,941,080 B2 * | 9/2005 | Kasper et al. | .................. | 398/186 |
| 7,003,007 B2 * | 2/2006 | Murata et al. | ............... | 372/38.02 |
| 7,011,458 B2 * | 3/2006 | Kagaya et al. | ................... | 385/92 |
| 7,130,100 B2 * | 10/2006 | Kagaya et al. | ................. | 359/237 |
| 7,149,024 B2 * | 12/2006 | Arima et al. | .................... | 359/237 |
| 7,194,012 B2 * | 3/2007 | Mason et al. | ............... | 372/38.02 |
| 7,329,894 B2 | 2/2008 | Kitatani et al. | | |
| 7,514,349 B2 | 4/2009 | Shiota et al. | | |
| 7,916,876 B1 * | 3/2011 | Helsloot et al. | ................... | 381/61 |
| 2002/0085256 A1 * | 7/2002 | Auracher et al. | ............. | 359/180 |
| 2003/0090774 A1 * | 5/2003 | Singh et al. | .................... | 359/248 |
| 2003/0103516 A1 | 6/2003 | Kitatani et al. | | |
| 2004/0169907 A1 * | 9/2004 | Singh et al. | .................... | 359/241 |

(Continued)

FOREIGN PATENT DOCUMENTS

| | | |
|---|---|---|
| JP | 06-230328 A | 8/1994 |
| JP | 2001-223437 A | 8/2001 |
| JP | 2002-094187 A | 3/2002 |
| JP | 2002-185079 A | 6/2002 |
| JP | 2003-007706 A | 1/2003 |
| JP | 2003-168845 A | 6/2003 |

(Continued)

*Primary Examiner* — Kenneth N Vanderpuye
*Assistant Examiner* — Hibret Woldekidan
(74) *Attorney, Agent, or Firm* — Foley & Lardner LLP (57) ABSTRACT

Provided are an optical transmitter device and an optical transmitter module which are capable of reducing the optical transmitter module size while maintaining a state where an excellent optical transmission waveform quality is obtained over a wide range of frequencies. The optical transmission module (2) includes a semiconductor laser diode device (10), an optical modulator device (12), and a first termination resistor circuit (14-1). A printed circuit board (4) includes a driver IC (16) and a second termination resistor circuit (14-2). A lower cutoff frequency of the first termination resistor circuit (14-1) and an upper cutoff frequency of the second termination resistor circuit (14-2) correspond to each other. An impedance of the first termination resistor circuit (14-1) in a pass frequency band thereof and an impedance of the second termination resistor circuit (14-2) in a pass frequency band thereof correspond to each other.

7 Claims, 10 Drawing Sheets

U.S. PATENT DOCUMENTS

| | | | |
|---|---|---|---|
| 2005/0047454 A1* | 3/2005 | Williamson, III | 372/26 |
| 2005/0088233 A1* | 4/2005 | Miyashita et al. | 330/252 |
| 2006/0008194 A1* | 1/2006 | Kagaya et al. | 385/1 |
| 2006/0028704 A1* | 2/2006 | Inoue et al. | 359/237 |
| 2006/0171011 A1* | 8/2006 | Nakajima | 359/239 |
| 2008/0055016 A1* | 3/2008 | Morris et al. | 333/129 |

FOREIGN PATENT DOCUMENTS

| | | |
|---|---|---|
| JP | 2004-319760 A | 11/2004 |
| JP | 2005-150181 A | 6/2005 |
| JP | 2006-303147 A | 11/2006 |
| JP | 2007-335804 A | 12/2007 |
| JP | 2008-186902 A | 8/2008 |

* cited by examiner

OPTICAL TRANSMITTER DEVICE AND OPTICAL TRANSMITTER MODULE

CROSS-REFERENCE TO RELATED APPLICATION

The present application claims priority from Japanese application JP 2009-062367 filed on Mar. 16, 2009, the content of which is hereby incorporated by reference into this application.

BACKGROUND OF THE INVENTION

1. Field of the Invention

The present invention relates to an optical transmitter device and an optical transmitter module.

2. Description of the Related Art

Optical modules with a semiconductor optical modulator device, or an optical modulator-integrated semiconductor laser chip, built in are used as one of the key devices of a transceiver for middle-to-long-distance optical fiber transmission. Optical transceivers have been increased in speed as broadband networks become popular, and now high transmission rate optical transceivers having a bit rate of 10 Gbits/s or higher are widely employed. Optical modules suitable for use in such optical transceivers are demanded to be small in size and low in power consumption, in addition to achieving an excellent optical transmission wavelength quality.

Electro-absorption (EA) optical modulator devices are often used as optical modulator devices which fit for size reduction. Electro-absorption optical modulator devices are driven with the output voltage waveform of a signal output circuit (e.g., driver IC). An impedance of the electro-absorption optical modulator device varies greatly depending on the ON/OFF state of an optical signal. Obtaining a favorable waveform by merely driving the electro-absorption optical modulator device alone is therefore difficult due to an impedance inconsistency. Many conventional optical modules obtain an excellent optical transmission waveform by placing a resistor device of approximately 50 Ohms close to an electro-absorption optical modulator device and by using the resistor device as a termination resistor of the signal output circuit, with one end of the resistor device connected to the optical modulator device and another end of the resistor device connected to a ground potential. However, in this type of optical modules having the termination circuit structure described above, the need to apply a bias voltage to the electro-absorption optical modulator device causes an originally unnecessary direct current in the resistor device, which can lead to inessential power consumption.

As a conventional technology of reducing power consumption, a structure has been proposed which places a termination resistor circuit with a resistor device and a single DC blocking capacitor device, or a plurality of parallelly connected DC blocking capacitor devices, connected in series close to an optical modulator device. An example of this structure is disclosed in JP 06-230328 A, where a termination resistor circuit made up of a chip resistor, a multi-layered ceramic capacitor, and a parallel-plate capacitor is placed close to an electro-absorption optical modulator device. In the termination resistor circuit, a multi-layered ceramic capacitor having a capacitance value of 0.01 microfarads and a parallel-plate capacitor having a capacitance value of 100 pF are connected in parallel, and the parallelly connected capacitors are connected in series to a chip resistor having a resistance value of 50 Ohms. JP 06-230328 A uses the parallel-plate capacitor which has excellent high-frequency characteristics to keep the impedance of the termination resistor circuit in a high frequency range at 50 Ohms, and uses the multi-layered ceramic capacitor which has excellent capability in increasing the capacity to keep the impedance of the termination resistor circuit in a low frequency range (frequency range above 300 kHz, which is a lower cutoff frequency) at 50 Ohms, thereby constructing a broadband termination resistor circuit, and balancing low power consumption and an excellent optical transmission waveform.

However, as optical transceivers become smaller in size in accordance with a standard called Multi Source Agreement (MSA), a problem has arisen in that the use of the conventional technology described above in building an optical module hinders size reduction. In order to meet SFP+, which is an MSA standard for 10-gigabit Ethernet (registered trademark) optical transceivers, an optical module on the transmission side (Transmitter Optical Sub Assembly: TOSA) needs to be implemented with the use of a 5.6 mm TO-CAN package, which is smaller in size than conventional ones. With the technology described in JP 06-230328 A, where a multi-layered ceramic capacitor having a capacitance value of 0.01 microfarads or more needs to be installed in an optical module, there is no space left for the multi-layered ceramic capacitor once an optical modulator-integrated semiconductor laser chip, a resistor device, and other components indispensable to the optical module are installed in a TO-CAN package that is 5.6 mm in diameter. Manufacturing a small-sized optical module with this technology is therefore difficult.

SUMMARY OF THE INVENTION

The present invention has been made in view of the problems described above, and it is therefore an object of the present invention to provide an optical transmitter device and an optical transmitter module that are capable of reducing the optical transmitter module size while maintaining a state where an excellent optical transmission waveform quality is obtained over a wide range of frequencies.

In order to solve the above-mentioned problems, an optical transmitter device according to the present invention includes: an optical transmitter module; and a printed circuit board which is electrically connected to the optical transmitter module, in which: the optical transmitter module includes: a light emitting device; an optical modulator for modulating light emitted from the light emitting device; and a first termination resistor circuit which is electrically connected to the optical modulator; the printed circuit board includes: a signal output circuit for outputting a signal supplied to the optical modulator; and a second termination resistor circuit which is electrically connected to the signal output circuit; a lower cutoff frequency of the first termination resistor circuit and an upper cutoff frequency of the second termination resistor circuit correspond to each other; and an impedance of the first termination resistor circuit in a pass frequency band thereof and an impedance of the second termination resistor circuit in a pass frequency band thereof correspond to each other.

Further, an optical transmitter module according to the present invention is an optical transmitter module electrically connected to a printed circuit board, which includes: a light emitting device; an optical modulator for modulating light emitted from the light emitting device; and a first termination resistor circuit which is electrically connected to the optical modulator, in which: the printed circuit board includes: a signal output circuit for outputting a signal supplied to the optical modulator; and a second termination resistor circuit which is electrically connected to the signal output circuit; a lower cutoff frequency of the first termination resistor circuit and an upper cutoff frequency of the second termination resistor circuit correspond to each other; and an impedance of the first termination resistor circuit in a pass frequency band thereof and an impedance of the second termination resistor circuit in a pass frequency band correspond thereof to each other.

According to the present invention, flat impedance characteristics are obtained over a wide range of frequencies from the lower cutoff frequency of the first termination resistor circuit to the upper cutoff frequency of the second termination resistor circuit. An excellent optical transmission waveform quality is therefore obtained over a wide range of frequencies. Further, with the second termination resistor circuit provided in the printed circuit board, the optical transmitter module can have a smaller size than that in prior art. The present invention can thus make an optical transmitter module small in size while maintaining a state where an excellent optical transmission waveform quality is obtained over a wide range of frequencies.

According to one aspect of the present invention, the optical transmitter device further includes a transmission line that electrically connects the optical transmitter module and the printed circuit board, in which: the impedance of the first termination resistor circuit in the pass frequency band thereof corresponds to a characteristic impedance of the transmission line; and the impedance of the second termination resistor circuit in the pass frequency band thereof corresponds to the characteristic impedance of the transmission line. According to the one aspect of the present invention, signal attenuation due to electrical return loss may be reduced.

Further, according to another aspect of the present invention, the optical transmitter device is provided in which a signal output from the signal output circuit has a given value or less as a difference between an amplitude at a junction where the first termination resistor circuit connects with the transmission line and an amplitude at a junction where the second termination resistor circuit connects with the transmission line. According to the another aspect of the present invention, a better optical transmission waveform quality may be obtained more easily than when an optical transmitter device is structured otherwise.

In the another aspect of the present invention, a ratio of a difference in the amplitude of the signal between the junction where the first termination resistor circuit connects with the transmission line and the junction where the second termination resistor circuit connects with the transmission line, to the amplitude of the signal output from the signal output circuit may be set to 5% or less.

Further, in the another aspect of the present invention, a time constant that corresponds to the lower cutoff frequency of the first termination resistor circuit may be equal to or larger than a value obtained by multiplying a delay time of the transmission line by a given number. This way, the transmission line can be set to a length suited to the lower cutoff frequency of the first termination resistor circuit, or the first termination resistor circuit can be set to a lower cutoff frequency suited to the length of the transmission line.

Further, in the another aspect of the present invention, the first termination resistor circuit may include a capacitor device and a resistor device, and a product of a capacitance value of the capacitor device and a resistance value of the resistor device may be equal to or larger than a value obtained by multiplying a delay time of the transmission line by a given number. This way, the transmission line can be set to a length suited to the capacitance value and the resistance value of the capacitor device and the resistor device that are contained in the first termination resistor circuit, or the capacitor device and the resistor device that are contained in the first termination resistor circuit can be set to a capacitance value and a resistance value suited to the length of the transmission line.

Further, in the another aspect of the present invention, the second termination resistor circuit may include an inductor device, and an inductance value of the inductor device included in the second termination resistor circuit may be corresponded to a product of a square of the resistance value of the resistor device included in the first termination resistor circuit and the capacitance value of the capacitor device included in the first termination resistor circuit. This way, the inductor device contained in the second termination resistor circuit can be set to an inductance value suited to the capacitance value and the resistance value of the capacitor device and the resistor device that are contained in the first termination resistor circuit, or the capacitor device and the resistor device that are contained in the first termination resistor circuit can be set to a capacitance value and a resistance value suited to the inductance value of the inductor device contained in the second termination resistor circuit.

DETAILED DESCRIPTION OF THE INVENTION

An embodiment of the present invention is described below in detail with reference to the accompanying drawings.

Figure 1:
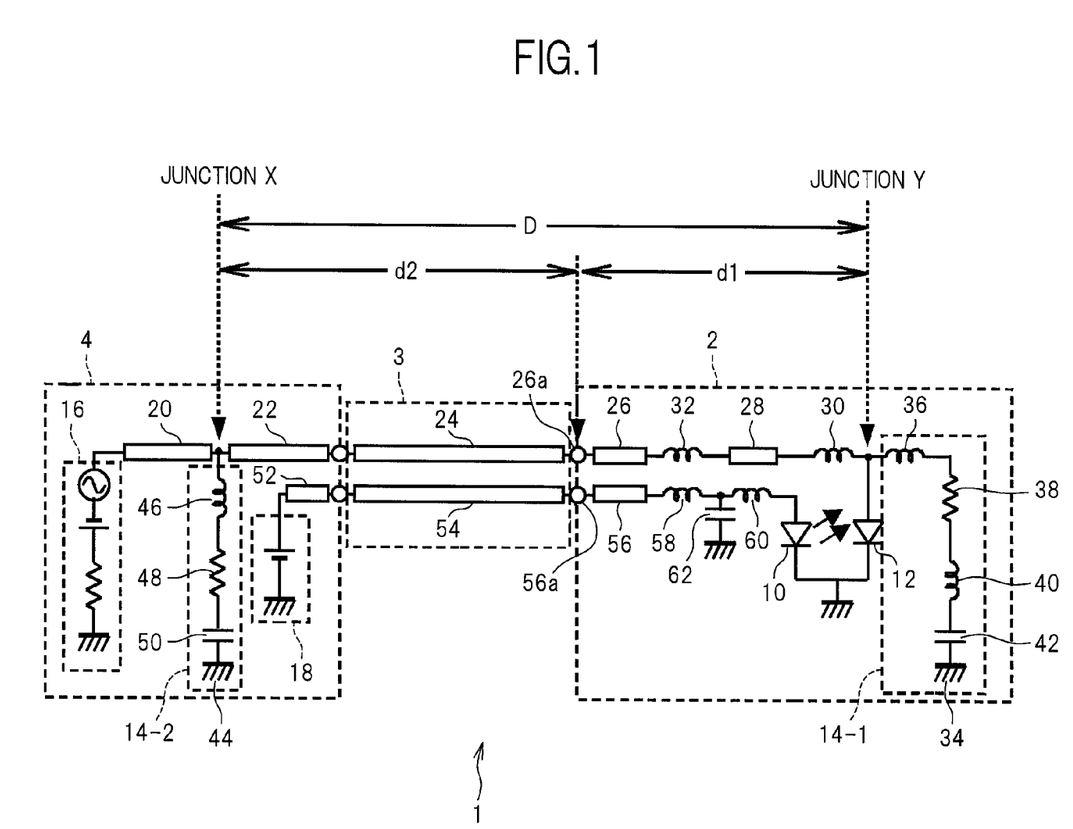
FIG. 1 is a diagram illustrating an example of major circuits in an optical transmitter device according to an embodiment of the present invention.
Figure 2:
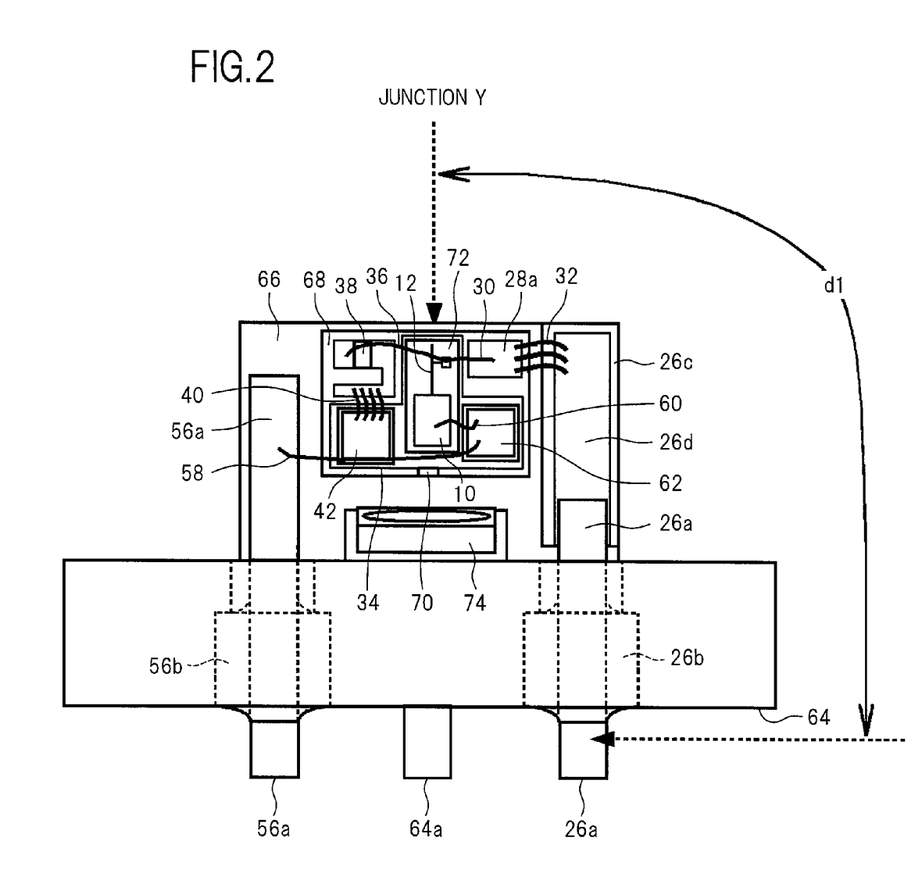
FIG. 2 is a diagram illustrating an example of the internal structure of an optical transmission module that is contained in the optical transmitter device according to the embodiment of the present invention.
Figure 3:
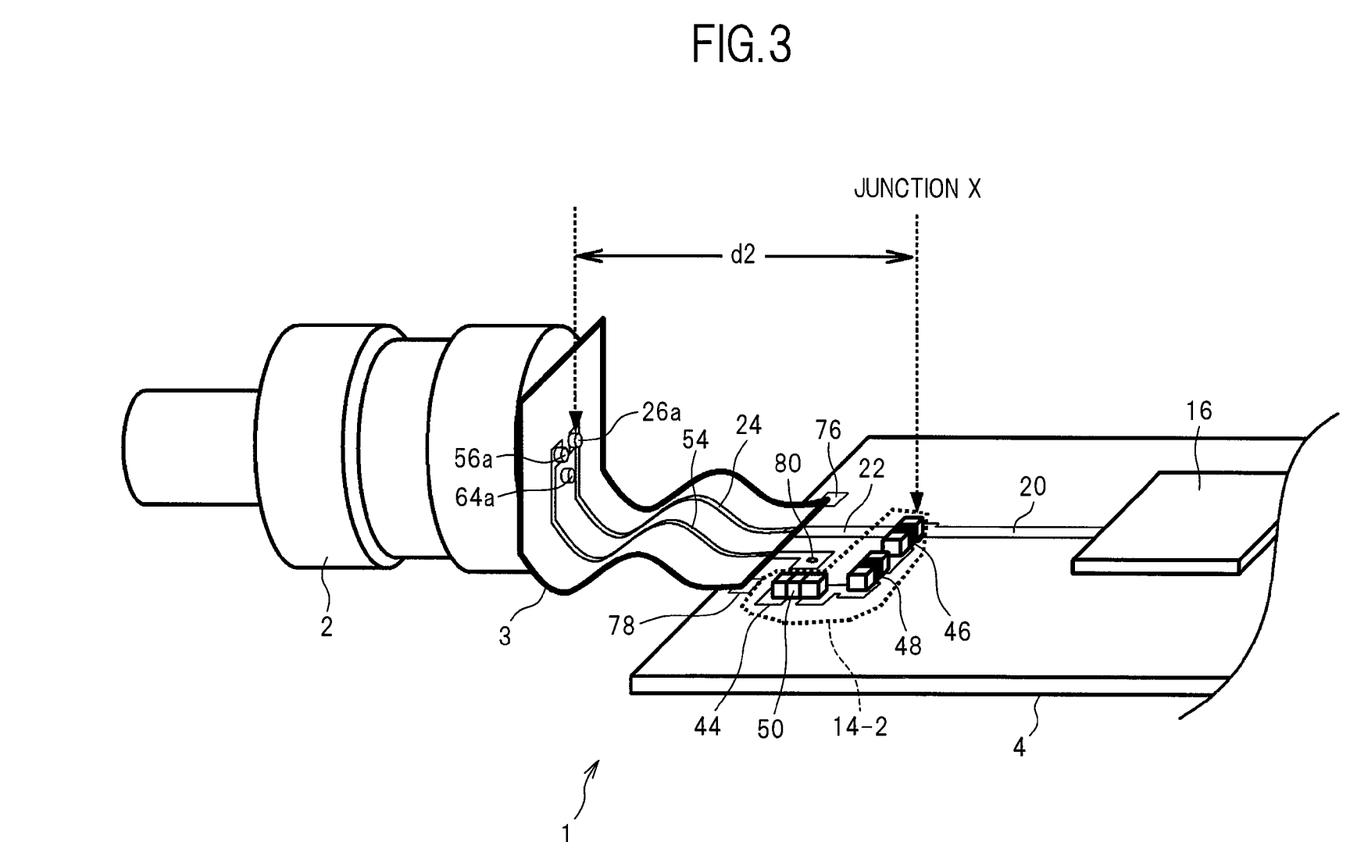
FIG. 3 is a diagram illustrating an example of major parts of the optical transmitter device according to the embodiment of the present invention.

FIG. 1 is a diagram illustrating an example of major circuits in an optical transmitter device 1 according to this embodiment. FIG. 2 is a diagram illustrating an example of the internal structure of an optical transmitter module 2 which is contained in the optical transmitter device 1 according to this embodiment. FIG. 3 is a diagram illustrating an example of major parts of the optical transmitter device 1 according to this embodiment.

The optical transmitter device 1 according to this embodiment includes the optical transmitter module 2, a flexible printed board 3, and a printed circuit board 4. The optical transmitter module 2 and the printed circuit board 4 are electrically connected to each other. The optical transmitter module 2 includes a light emitting device (for example, a semiconductor laser diode device 10 in this embodiment), an optical modulator device 12 for modulating light emitted from the light emitting device, and a first termination resistor circuit 14-1 which is electrically connected to the optical modulator device 12. The printed circuit board 4 includes a signal output circuit (for example, a driver IC 16 in this embodiment) for outputting a signal (electrical modulation signal) supplied to the optical modulator device 12, a second termination resistor circuit 14-2 which is electrically connected to the signal output circuit, and a laser current supply circuit 18 for supplying a direct current to the semiconductor laser diode device 10.

In this embodiment, an electrical modulation signal output from the driver IC 16 is input to one end of the optical modulator device 12 through a transmission line 20 and a transmission line 22 which are included in the printed circuit board 4 (for example, by running on the printed circuit board 4), through a transmission line 24 which is included in the flexible printed board 3 (for example, by running on the flexible printed board 3), and through a transmission line 26 and a transmission line 28 which are included in the optical transmitter module 2 (for example, by being housed inside the optical transmitter module 2). Another end of the optical modulator device 12 is grounded within the optical transmitter module 2. The optical transmitter module 2 in this embodiment includes, for example, an inductor device (bonding wire) 30 for connecting the optical modulator device 12 and the transmission line 28, and an inductor device (bonding wire) 32 for connecting the transmission line 26 and the transmission line 28. Preferably, the inductor device (bonding wire) 30 and the inductor device (bonding wire) 32 are short, or provided in multitudes and arranged in parallel to one another, so that the inductor devices 30 and 32 take as small inductance values as possible.

The first termination resistor circuit 14-1 is connected at one end to a junction Y, where the optical modulator device 12 and the inductor device (bonding wire) 30 are connected to each other, and is connected at another end to a ground electrode 34. The first termination resistor circuit 14-1 includes an inductor device (bonding wire) 36, a resistor device 38, an inductor device (bonding wire) 40, and a capacitor device 42, which are connected in series. The second termination resistor circuit 14-2 is connected at one end to a junction X, where the transmission line 20 and the transmission line 22 are connected to each other, and is connected at another end to a ground electrode 44. The second termination resistor circuit 14-2 includes an inductor device 46, a resistor device 48, and a capacitor device 50, which are connected in series. In this embodiment, the driver IC 16 has a function of supplying a bias voltage to the optical modulator device 12, and is connected to the optical modulator device 12 by direct current connection. The capacitor device 42 contained in the first termination resistor circuit 14-1 and the capacitor device 50 contained in the second termination resistor circuit 14-2 act as direct current (DC) blocking capacitors, thereby avoiding the generation of an unnecessary direct current at the output of the driver IC 16.

The semiconductor laser diode device 10 in this embodiment emits unmodulated continuous laser light by performing photoelectric conversion on, for example, a direct current that is supplied from the laser current supply circuit 18 through a transmission line 52 which is included in the printed circuit board 4 (for example, by running on the printed circuit board 4), a transmission line 54 which is included in the flexible printed board 3 (for example, by running on the flexible printed board 3), and a transmission line 56, an inductor device (bonding wire) 58, and an inductor device (bonding wire) 60, which are included in the optical transmitter module 2 (for example, by being housed inside the optical transmitter module 2). A decoupling capacitor device 62 is electrically connected to a junction between the inductor device (bonding wire) 58 and the inductor device (bonding wire) 60.

The optical transmitter module 2 uses as its housing a CAN package housing which includes a metal stem 64 and a metal mount 66 for mounting major parts. The metal stem 64 has columnar lead pins 26*a* and 56*a* installed through cylindrical through holes. The lead pin 26*a* and the lead pin 56*a* are fixed by sealing glass 26*b* and sealing glass 56*b*, respectively. A lead pin 64*a* for a ground potential is connected directly to the metal stem 64. A relay substrate 26*c* and a carrier substrate 68 are mounted onto the metal mount 66. A wiring pattern 26*d* which corresponds to the transmission line 26 is provided on the relay substrate 26*c*. A wiring pattern 28*a* which corresponds to the resistor device 38, the ground electrode 34, and the transmission line 28 is provided on a surface of the carrier substrate 68. The ground electrode 34 is connected to a rear face electrode of the carrier substrate 68 through a via hole 70. The rear face electrode of the carrier substrate 68 is connected to the metal mount 66 to be equipotential with the metal stem 64 and the lead pin 64*a*. A semiconductor chip 72, the capacitor device 42, and the capacitor device 62 are mounted to the carrier substrate 68. The semiconductor chip 72 in this embodiment is, for example, a modulator-integrated semiconductor laser chip with the semiconductor laser diode device 10 and the optical modulator device 12 provided on its surface. The unmodified continuous laser light output from the semiconductor laser diode device 10 passes through the optical modulator device 12 and then enters an optical fiber via a coupling lens (not shown). The optical modulator device 12 modulates the continuous laser light into an optical modulation signal with the use of an electric modulation signal sent at a rate of 10 Gbits/s from the driver IC 16. A monitoring-use photodiode 74 is provided on the metal stem 64. The monitoring-use photodiode 74 is fixed in a place that allows the monitoring-use photodiode 74 to receive backward output light of the semiconductor laser diode device 10. The inductor device (bonding wire) 30 connects the wiring pattern 28*a* and the optical modulator device 12, while the inductor device (bonding wire) 36 connects the optical modulator device 12 and one end of the resistor device 38. The inductor device (bonding wire) 40 connects another end of the resistor device 38 and an upper electrode of the capacitor device 42. A lower electrode of the capacitor device 42 is connected to the ground electrode 34. The inductor device (bonding wire) 32 which connects the wiring pattern 28*a* on the carrier substrate 68 and the wiring pattern 26*d* on the relay substrate 26*c* preferably connects at a low inductance by means of a plurality of wires, ribbon wires, or the like. The wiring pattern 26*d* and the lead pin 26*a* are bonded by, for example, an AuSn alloy. An electrical signal input path from the lead pin 26*a* to the optical modulator device 12 is structured in this manner.

The semiconductor laser diode device 10 is connected to the lead pin 56a through the feeding-use inductor device (bonding wire) 58 and inductor device (bonding wire) 60. A direct current is supplied from the lead pin 56a. The parts described above are hermetically sealed by the CAN package housing.

The CAN package housing employed in this embodiment is, for example, a TO-56 housing having a diameter of 5.6 mm. Inexpensive iron is favorable as the material of the metal stem 64 and the metal mount 66 because it lowers cost. The relay substrate 26c and the carrier substrate 68 are formed of, for example, a dielectric material such as alumina or aluminum nitride. When the carrier substrate 68 is formed of aluminum nitride which is high in thermal conductivity, a thermal resistance in a section from the semiconductor chip 72 to the metal mount 66 is lowered and a rise in device temperature is reduced. The carrier substrate 68 may be a substrate formed by bonding a dielectric substrate such as an aluminum nitride substrate and a metal plate such as a copper-tungsten plate together. This is suitable for lowering the thermal resistance further. The resistor device 38 is formed from a tantalum nitride film and adjusted to have a resistance value of 50 Ohms by, for example, laser trimming. The semiconductor chip 72 is, for example, an n-type InP substrate with the semiconductor laser diode device 10 which is a distributed feedback laser diode (DFB-LD), and the optical modulator device 12 which is an electro-absorption modulator (EAM), formed on its surface. The chip surface of the semiconductor chip 72 is provided with an anode electrode of the semiconductor laser diode device 10 and an anode electrode of the optical modulator device 12. Forming the inductor device (bonding wire) 30 and the inductor device (bonding wire) 36 linearly from a single wire with the anode electrode of the optical modulator device 12 as a relay point minimizes the area of the anode electrode of the optical modulator device 12, to thereby reduce the device capacitance to be favorable for high-speed operation. A rear face electrode of the semiconductor chip 72 is, for example, a common cathode electrode that is common to the semiconductor laser diode device 10 and the optical modulator device 12. The monitoring-use photodiode 74 outputs through another lead pin (not shown). Parallel-plate capacitors (single-layer capacitors) formed from a single layer of high dielectric ceramic, for example, are used as the capacitor device 42 and the capacitor device 62. The parallel-plate capacitors use, for example, high dielectric ceramic having a specific dielectric constant of 22,000, and are 0.38 mm in length, 0.38 mm in width, and 0.15 mm in thickness, for example. In this embodiment, the capacitance value of the capacitor device 42 is 330 pF. The optical transmitter module 2 in this embodiment is thus made small enough to be packaged in a CAN package housing that is 5.6 mm in diameter.

In this embodiment, a micro strip line including the wiring pattern 28a on the carrier substrate 68 an example of which is illustrated in FIG. 2 constitutes the transmission line 28 in the circuit diagram of FIG. 1. A micro strip line including the wiring pattern 26d on the relay substrate 26c in FIG. 2, together with a coaxial line that includes one of the cylindrical through holes in the metal stem 64, the sealing glass 26b, and the lead pin 26a, constitutes the transmission line 26 in the circuit diagram of FIG. 1. The optical transmitter device 1 in this embodiment sets 4 mm, for example, to a length d1 which is the length of a signal wiring line from the junction between the lead pin 26a and the flexible printed board 3 to the optical modulator device 12, i.e., to the junction between the optical modulator device 12 and the first termination resistor circuit 14-1. The delay time in this case is 27 ps. A coaxial line in FIG. 2 that includes one of the cylindrical through holes in the metal stem 64, the sealing glass 56b, and the lead pin 56a constitutes the transmission line 56 in the circuit diagram of FIG. 1.

The flexible printed board 3 connects the optical transmitter module 2 and the printed circuit board 4 while maintaining its flexibility. The flexible printed board 3 in this embodiment is, for example, a 50 micrometers-thick polyimide film with a piece of copper foil that is 30 micrometers in thickness adhered to each side thereof. A cover lay having a thickness of 40 micrometers is further adhered to each side of this assembly to serve as a protective film. The transmission line 24 and the transmission line 54 are micro strip lines with the front face copper foil acting as a strip conductor and the rear face copper foil acting as a ground conductor. The strip conductor is given a line width of 80 micrometers to set the characteristic impedance of the strip conductor to 50 Ohms. In this embodiment, a wiring line (not shown) that connects to an output terminal of a photodiode is provided among others on the flexible printed board 3. The ground conductor which is the rear face copper foil of the flexible printed board 3 is connected to the lead pin 64a of the optical transmitter module 2 and to ground electrodes 76 and 78 of the printed circuit board 4.

The printed circuit board 4 is, for example, a glass epoxy substrate formed from an FR4 board or the like. The second termination resistor circuit 14-2 includes surface-mounted parts. The capacitor device 50 is, for example, a 1005-size multi-layered ceramic capacitor having a capacitance value of 0.1 microfarads. The resistor device 48 is, for example, a 1608-size thick-film chip resistor having a resistance value of 50 Ohms. The inductor device 46 is, for example, a 1608-size inductor having an inductance value of 820 nH. Those parts are, unlike the parts of the first termination resistor circuit 14-1 housed in the optical transmitter module 2 which has to be hermetically sealed, readily replaceable when the electric characteristics need an adjustment. A signal line length d2 from the junction between the flexible printed board 3 and the lead pin 26a to the second termination resistor circuit 14-2 in this embodiment is 26 mm, for example. A delay time that corresponds to this length d2 is 119 ps.

The driver IC 16 used in this embodiment is the type that has a built-in bias voltage supply circuit. The transmission line 20 is connected to the laser current supply circuit 18 on the printed circuit board 4 through a via hole 80.

In this embodiment, for example, the lengths of the transmission lines are set such that a delay time td in a section from the junction X to the junction Y (which corresponds to the electrical length) is 168 ps or less. The transmission line 20, the transmission line 22, the transmission line 24, the transmission line 26, and the transmission line 28 in this embodiment each have a characteristic impedance of 50 Ohms. In this embodiment, the inductor device (bonding wire) 36, the resistor device 38, the inductor device (bonding wire) 40, and the capacitor device 42 which are contained in the first termination resistor circuit 14-1 have an inductance value of 0.7 nH, a resistance value of 50 Ohms, an inductance value of 0.3 nH, and a capacitance value of 330 pF, respectively. In this embodiment, the inductor device (bonding wire) 46, the resistor device 48, and the capacitor device 50 which are contained in the second termination resistor circuit 14-2 have an inductance value of 820 nH, a resistance value of 50 Ohms, and a capacitance value of 0.1 microfarads, respectively.

Figure 4:
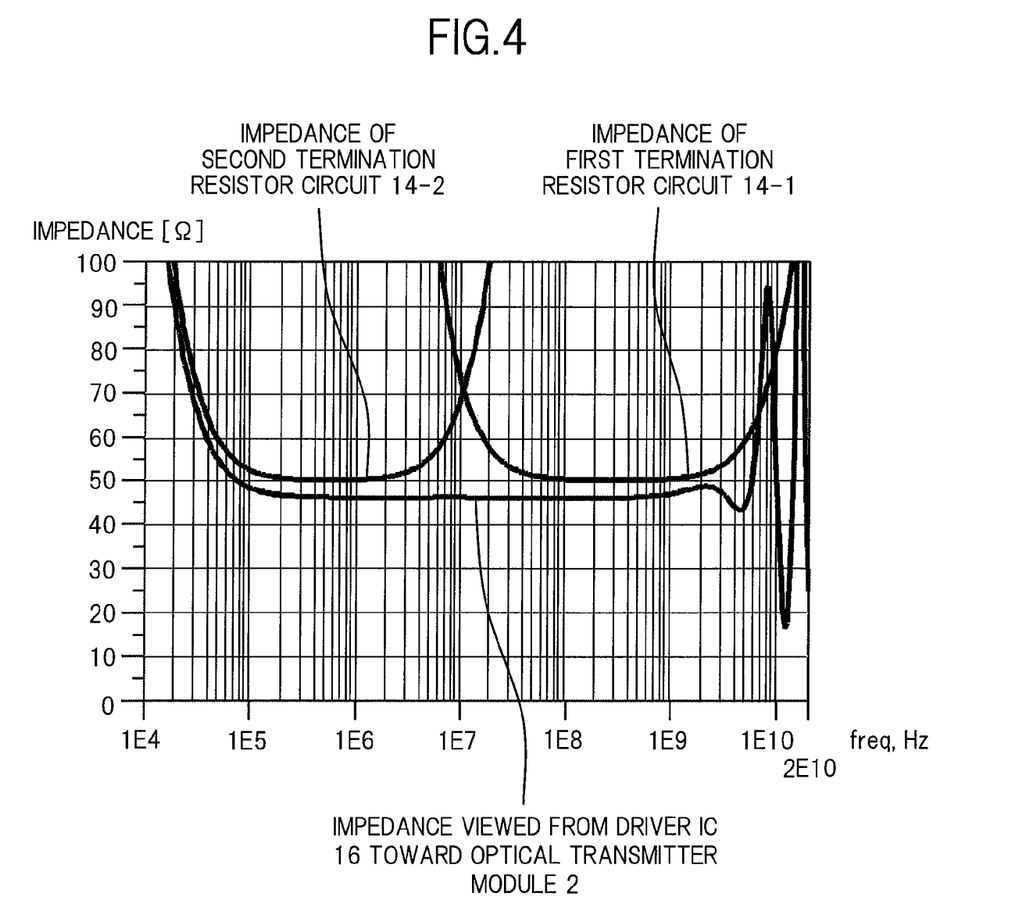
FIG. 4 is a diagram illustrating frequency characteristics of a first termination resistor circuit and a second termination resistor circuit.

FIG. 4 is a diagram illustrating the frequency characteristics of the first termination resistor circuit 14-1 and the second termination resistor circuit 14-2. In the following description, the resistance value of the resistor device 38 contained in the first termination resistor circuit 14-1 (in this embodiment, the resistance value of the resistor device 38 is also the resistance value of the resistor device 48 of the second termination resistor circuit) is denoted by Rterm, the capacitance value of the capacitor device 42 of the first termination resistor circuit 14-1 is denoted by Cterm, the capacitance value of the capacitor device 50 contained in the second termination resistor circuit 14-2 is denoted by C, the inductance value of the inductor device 46 of the second termination resistor circuit 14-2 is denoted by Lterm, and the sum of the inductance values of the inductor device (bonding wire) 36 and the inductor device (bonding wire) 40 which are contained in the first termination resistor circuit 14-1 is denoted by L. In this embodiment, the impedance of the first termination resistor circuit 14-1 which includes a series LCR circuit, is kept at 50 Ohms (corresponding to the characteristic impedance of the transmission lines in this embodiment) over a wide range of frequencies (pass frequency band of the first termination resistor circuit 14-1). In a high frequency range, the first termination resistor circuit 14-1 acts as an LR filter and, accordingly, the impedance of the first termination resistor circuit 14-1 rises and the upper cutoff frequency of the first termination resistor circuit 14-1 is approximated by Rterm/(2*pi*L). Setting the inductance values of the inductor device (bonding wire) 36 and the inductor device (bonding wire) 40 small allows the first termination resistor circuit 14-1 to keep its impedance at 50 Ohms over a frequency range that exceeds 1 GHz. In a low frequency range, the first termination resistor circuit 14-1 acts as a CR filter and, accordingly, the impedance rises and the lower cutoff frequency of the first termination resistor circuit 14-1 is approximated by 1/(2*pi*Cterm*Rterm). The lower cutoff frequency in this embodiment is 10 MHz. The impedance of the second termination resistor circuit 14-2 which similarly includes a series LCR circuit, is kept at 50 Ohms (corresponding to the characteristic impedance of the transmission lines in this embodiment) over a wide range of frequencies (pass frequency band of the second termination resistor circuit 14-2) as well. In a low frequency range, the second termination resistor circuit 14-2 acts as a CR filter and, accordingly, the impedance rises and the lower cutoff frequency of the second termination resistor circuit 14-2 is approximated by 1/(2*pi*C*Rterm). Setting the capacitance value of the capacitor device 50 to 0.1 microfarads lowers the lower cutoff frequency to 32 kHz, and it is low enough to satisfy lower frequency characteristics required in an optical communication system where the bit rate is 10 Gbits/s. In a high frequency range, the second termination resistor circuit 14-2 acts as an LR filter and, accordingly, the impedance rises and the upper cutoff frequency of the second termination resistor circuit 14-2 is approximated by Rterm/(2*pi*Lterm). The upper cutoff frequency when Rterm and Lterm take the numerical values described above is 10 MHz.

In this embodiment, the lower cutoff frequency of the first termination resistor circuit 14-1 and the upper cutoff frequency of the second termination resistor circuit 14-2 thus correspond to each other. The lower cutoff frequency of the first termination resistor circuit 14-1 and the upper cutoff frequency of the second termination resistor circuit 14-2, however, do not always need to match as is described later. This embodiment is also structured in a manner that makes the impedance of the first termination resistor circuit 14-1 in its pass frequency band and the impedance of the second termination resistor circuit 14-2 in its pass frequency band correspond to each other.

In this embodiment where those first termination resistor circuit 14-1 and second termination resistor circuit 14-2 are used, an impedance viewed from the driver IC 16 toward the optical transmitter module 2 has flat characteristics over a wide range of frequencies from 32 kHz to and past 1 GHz as illustrated in FIG. 4. When a frequency $f_0$ is 10 MHz, which is the lower cutoff frequency of the first termination resistor circuit 14-1 and the upper cutoff frequency of the second termination resistor circuit 14-2 in the example described above, the first termination resistor circuit 14-1 acts dominantly in a frequency range above the frequency $f_0$, and the second termination resistor circuit 14-2 acts dominantly in a frequency range below the frequency $f_0$.

Figure 5:
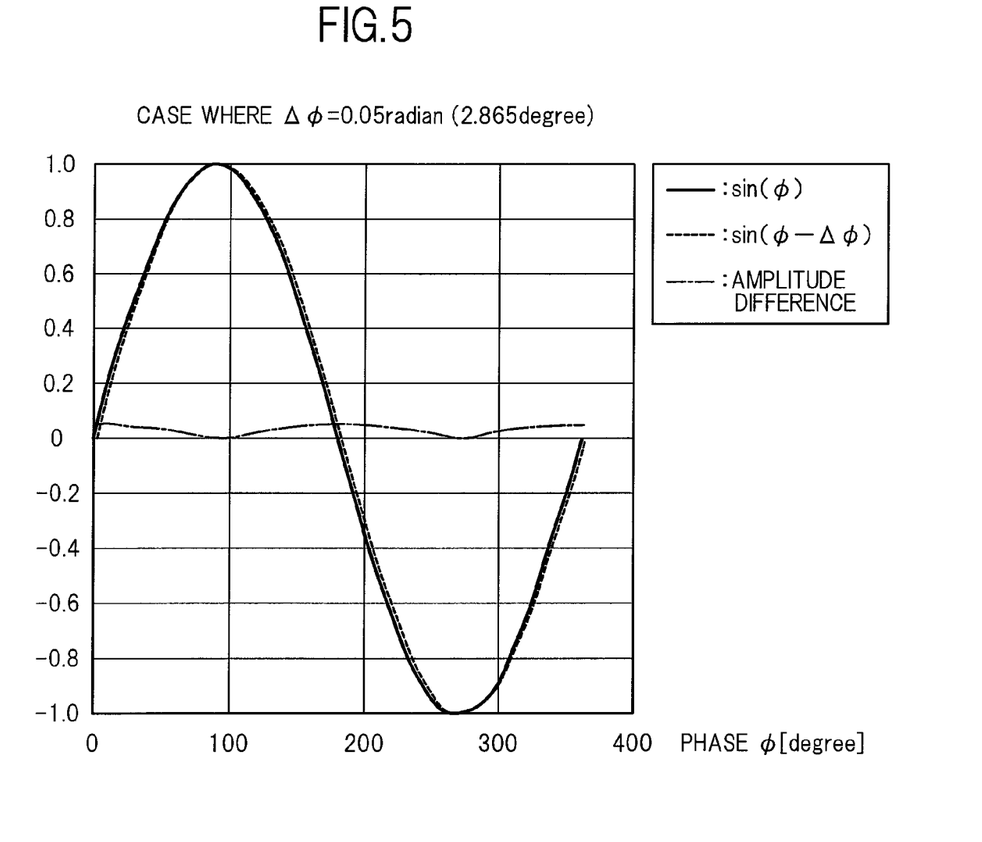
FIG. 5 is a diagram illustrating an example of a relation between a phase and a signal amplitude difference.

FIG. 5 is a diagram illustrating an example of the relation between the phase and the signal amplitude difference. Referring to FIG. 5, what influence a difference in termination register location along a transmission line has on an amplitude change is described. At the frequency $f_0$ where a switch is made between the first termination resistor circuit 14-1 and the second termination resistor circuit 14-2, the location difference between the junction X and the junction Y causes a phase difference delta phi for small-signal propagation characteristics S21. When a component of an electrical modulation signal at the frequency $f_0$ is A*sin(phi) the phase difference delta phi due to the difference in termination resistor location results in a fluctuation range delta A generated in signal amplitude which is expressed as A*(sin (phi)−sin (phi−(delta phi))). In a range where delta phi is sufficiently small in relation to phi, |(delta A)/A|=(delta phi)*|cos(phi)| is satisfied. As illustrated in FIG. 5, |(delta A)/A| takes a maximum value delta phi when phi is zero.

Reducing the amplitude error (delta A)/A in the electrical waveform more equals a better optical transmission waveform quality. A condition of the phase difference delta phi for satisfying this condition "|(delta A)/A|<=0.05" is |(delta A)/A|max=(delta fai)<=0.05 radian (hereinafter, angles are all measured by radian measure). The optical transmitter device 1 in this embodiment is structured such that a signal output from the driver IC 16 has a given value or less as a difference between the amplitude at the junction Y where the first termination resistor circuit 14-1 connects with the transmission line, and the junction X where the second termination resistor circuit 14-2 connects with the transmission line. More specifically, the ratio of the difference in signal amplitude between the junction Y where the first termination resistor circuit 14-1 connects with the transmission line, and the junction X where the second termination resistor circuit 14-2 connects with the transmission line, to the amplitude of a signal output from the driver IC 16 is set to 5% or less.

When the propagation wavelength of an electromagnetic wave along a transmission line at the frequency $f_0$ is lambda g, an electrical length D from the junction X to the junction Y is ((delta phi)/pi)*(lambda g). The delay time td of a signal that is propagated over the length D from the junction X to the junction Y is expressed with the use of delta phi as td=D/($f_0$*(lambda g))=(delta phi)/(pi*$f_0$). Therefore, td is required to satisfy a relation "td<=0.05/(pi*$f_0$)=0.1/(2*pi*$f_0$)." A relational expression "1/(2*pi*$f_0$)>=10*td" is obtained from the above.

In this embodiment, a time constant 1/(2*pi*$f_0$) which corresponds to the frequency $f_0$ is 16 ns, and takes a sufficiently large value in relation to the delay time td in the section from the junction X to the junction Y which is 168 ps. Specifically, the time constant 1/(2*pi*$f_0$) should be equal to or larger than a value obtained by multiplying the delay time td by a given number (in this embodiment, ten times larger than td or more). Those numerical values may be varied within a range where the relational expression "1/(2*pi*$f_0$)>=10*td" is satisfied. Further, the optical transmitter device 1 may be structured such that the time constant corresponding to the lower cutoff frequency of the first termination resistor circuit 14-1 is equal to or larger than a value obtained by multiplying the delay time of a transmission line by a given number according to the ratio of the difference in signal amplitude between the junction Y where the first termination resistor circuit 14-1 connects with the transmission line, and the junction X where the second termination resistor circuit 14-2 connects with the transmission line, to the amplitude of a signal output from the driver IC 16.

Figure 6A:
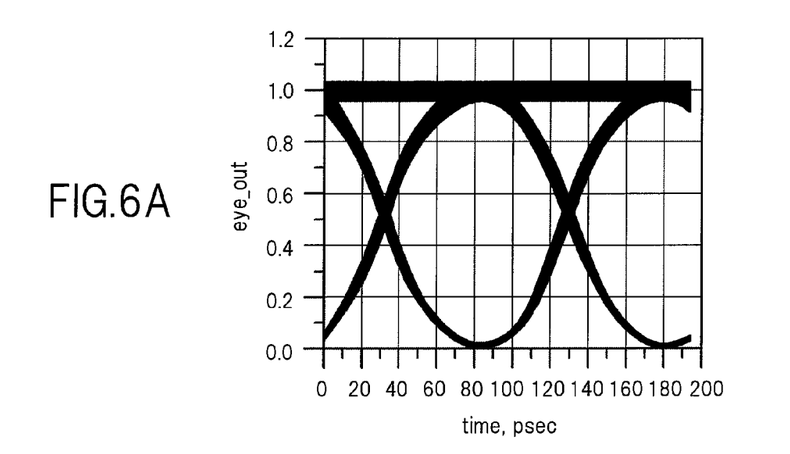
FIG. 6A is a diagram illustrating an example of an optical output waveform.
Figure 6B:
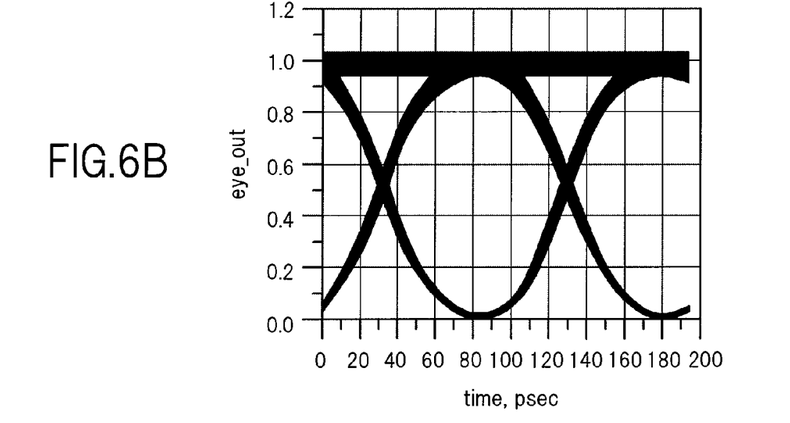
FIG. 6B is a diagram illustrating another example of an optical output waveform.
Figure 6C:
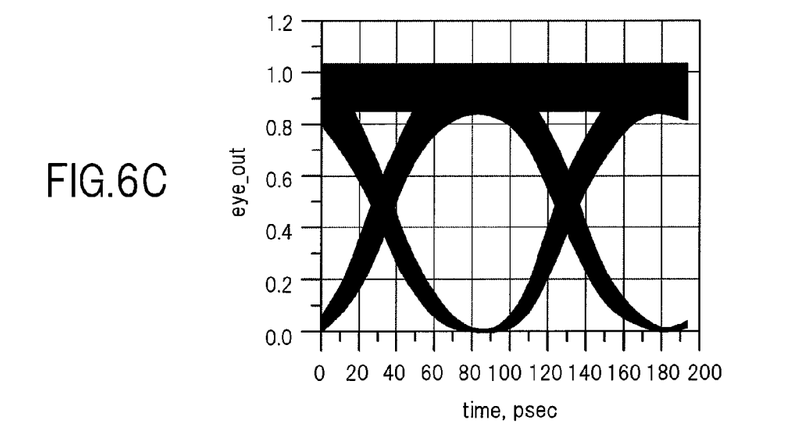
FIG. 6C is a diagram illustrating still another example of an optical output waveform.

FIG. 6A is a diagram illustrating an example of an optical output waveform that is calculated through simulation when the delay time td and the time constant $1/(2*pi*f_0)$ satisfy the above-mentioned relational expression with enough margin at 168 ps (D=30 mm) and 16 ns (Cterm=330 pF), respectively. FIG. 6B is a diagram illustrating an example of an optical output waveform that is calculated through simulation when the delay time td and the time constant $1/(2*pi*f_0)$ satisfy the above-mentioned relational expression without margin at 168 ps (D=30 mm) and 1.6 ns (Cterm=33 pF), respectively. FIG. 6C is a diagram illustrating an example of an optical output waveform that is calculated through simulation when the delay time td and the time constant $1/(2*pi*f_0)$ do not satisfy the above-mentioned relational expression at 168 ps (D=30 mm) and 500 ps (Cterm=10 pF), respectively.

As illustrated in the examples of FIGS. 6A to 6C about the results of optical output waveform calculation, an excellent optical transmission waveform quality is obtained under the conditions of FIGS. 6A and 6B, whereas a satisfactory waveform quality cannot be obtained under the condition of FIG. 6C due to noise and jitters in the waveform which make the waveform thick. The waveform quality obtained when the above-mentioned relational expression is satisfied is thus better than when the relational expression is not satisfied.

The above-mentioned relational expression can be replaced with a relational expression "Cterm*Rterm>=10*td" because the lower cutoff frequency $f_0$ of the first termination resistor circuit 14-1 is approximated by $1/(2*pi*Cterm*Rterm)$. The capacitance value Cterm of the capacitor device 42 and the resistance value Rterm of the resistor device 38 may be set to values that satisfy this replacement relational expression. The optical transmitter device 1 may thus be structured such that the product of the capacitance value of the capacitor device 42 and the resistance value of the resistor device 38 is equal to or larger than a value obtained by multiplying the delay time of the transmission line by a given number. When this condition is satisfied, the inductance value Lterm of the inductor device 46 can easily be adjusted in the second termination resistor circuit 14-2 by, for example, experimentally adjusting Lterm to a value that leads to desired optical output characteristics.

The substrate material of the printed circuit board 4 and the flexible printed board 3 normally has a specific dielectric constant of 4 or less. When micro strip lines are used as transmission lines that are formed on those substrates, an effective specific dielectric constant epsilon eff is therefore 3 or less. A wavelength shortening ratio ((lambda g)/(lambda o)) of the transmission lines is expressed with the use of the effective specific dielectric constant epsilon eff as 1/(sqrt (epsilon eff)), and the delay time td of the transmission lines is accordingly expressed as td=D/(c*(lambda g)/(lambda o))=(sqrt(epsilon eff))/c*D (c represents the speed of light in vacuum). This expression is substituted in the relational expression "Cterm*Rterm>=10*td" to obtain a relational expression "Cterm>=10/Rterm*td=10/Rterm*(sqrt(epsilon eff))/c*D" Substituting Rterm=50 Ohms, c=3.0×10$^8$ [m/s], and epsilon eff<=3 in this expression results in a relational expression "Cterm>=D×1.1×10$^{-9}$ [F/m]". The capacitance value Cterm of the capacitor device 42 and the length D from the junction X to the junction Y may be set to values that satisfy this relational expression. When this condition is satisfied, the inductance value Lterm of the inductor device 46 can easily be adjusted in the second termination resistor circuit 14-2 by, for example, experimentally adjusting Lterm to a value that leads to desired optical output characteristics. The signal wiring line length D is preferably 10 mm or more in order to mount the second termination resistor circuit 14-2 on the printed circuit board 4 and to connect the optical transmitter module 2 via the flexible printed board 3 without inconveniences in mounting.

Figure 7:
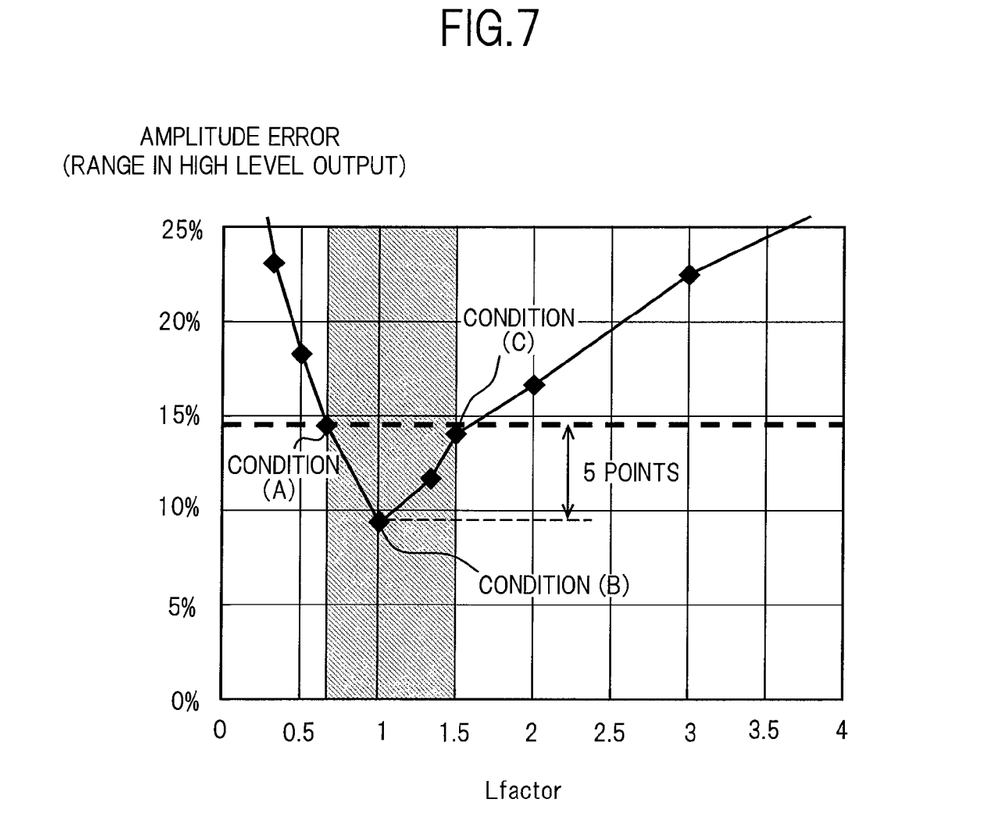
FIG. 7 is a diagram illustrating an example of an amplitude error in the optical output waveform.
Figure 8A:
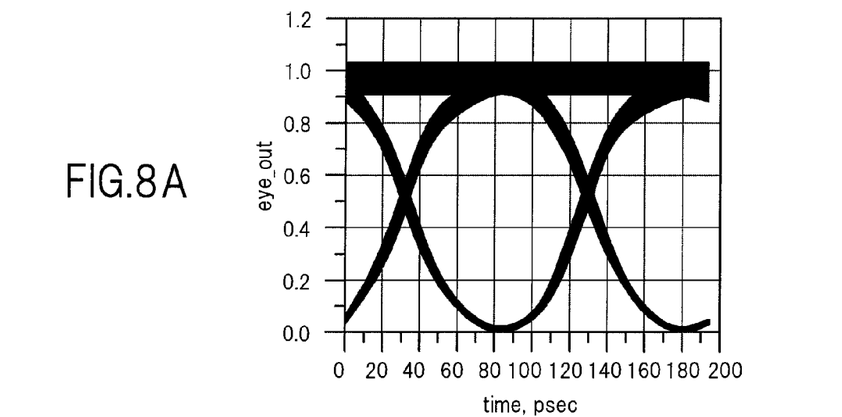
FIG. 8A is a diagram illustrating an example of an optical output waveform.
Figure 8B:
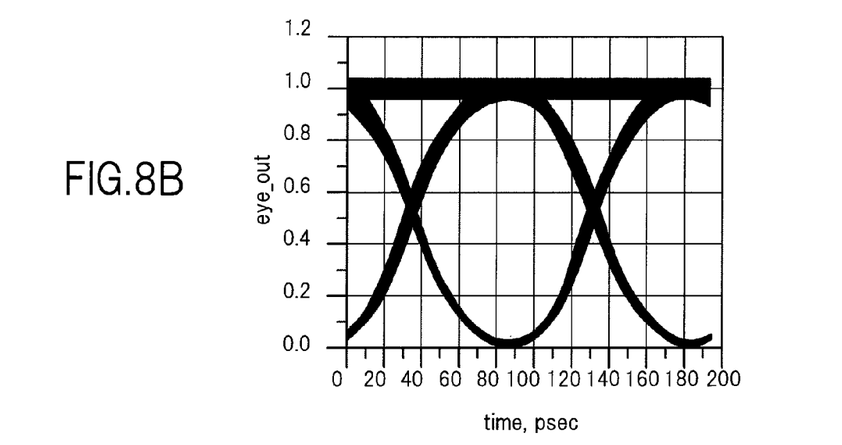
FIG. 8B is a diagram illustrating another example of an optical output waveform.
Figure 8C:
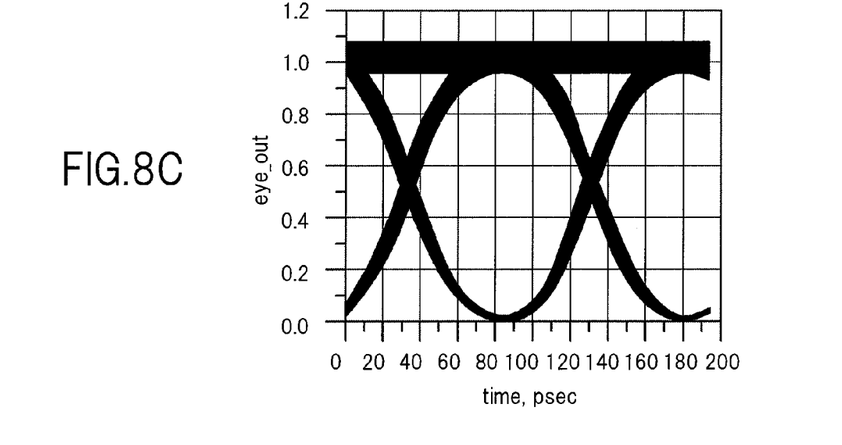
FIG. 8C is a diagram illustrating still another example of the optical output waveform.

A proportionality factor L factor is defined by a relational expression "Lterm=((Rterm)^2*Cterm)*Lfactor". FIG. 7 illustrates an example of an amplitude error in the optical output waveform that is observed when the value of Lfactor is varied through simulation. The optimum value of Lfactor is 1 (condition (B) in FIG. 7) as described above. When Lfactor is 1, a relational expression "Lterm=((Rterm)^2*Cterm)" is satisfied. As Lfactor increases from 1, the amplitude error increases, and the amplitude error when Lfactor is 1.5 (condition (C) in FIG. 7) is larger than when Lfactor is 1 by five points. The amplitude error also increases as Lfactor decreases from 1, and the amplitude error when Lfactor is 0.666 (condition (A) in FIG. 7) is larger than when Lfactor is 1 by five points. From this result, a relational expression "2/3<=Lfactor<=3/2" is obtained as a condition for the amplitude error to fall within a range that is five points from the optimum value. Then a relational expression "(Rterm)^2*Cterm×2/3<=Lterm<=(Rterm)^2×Cterm*3/2" is obtained. The optical transmitter device 1 may be structured such that the inductance value of the inductor device 46 which is contained in the second termination resistor circuit 14-2 thus corresponds to the product of the square of the resistance value of the resistor device 38 which is contained in the first termination resistor circuit 14-1, and the capacitance value of the capacitor device 42 which is contained in the first termination resistor circuit 14-1 (for instance, the ratio of the inductance value of the inductor device 46 which is contained in the second termination resistor circuit 14-2, and the product of the square of the resistance value of the resistor device 38 which is contained in the first termination resistor circuit 14-1, and the capacitance value of the capacitor device 42 which is contained in the first termination resistor circuit 14-1 satisfies a given relation (falls within a given range)). FIGS. 8A to 8C are diagrams illustrating examples of the results of optical output waveform calculation. FIG. 8A corresponds to the condition (A) in FIG. 7. FIG. 8B corresponds to the condition (B) in FIG. 7. FIG. 8C corresponds to the condition (C) in FIG. 7. FIGS. 8A to 8C illustrate that the optical transmission waveform quality obtained when the above-mentioned condition is met is better than when the above-mentioned condition is not met.

The present invention is not limited to the embodiment described above.

Figure 9:
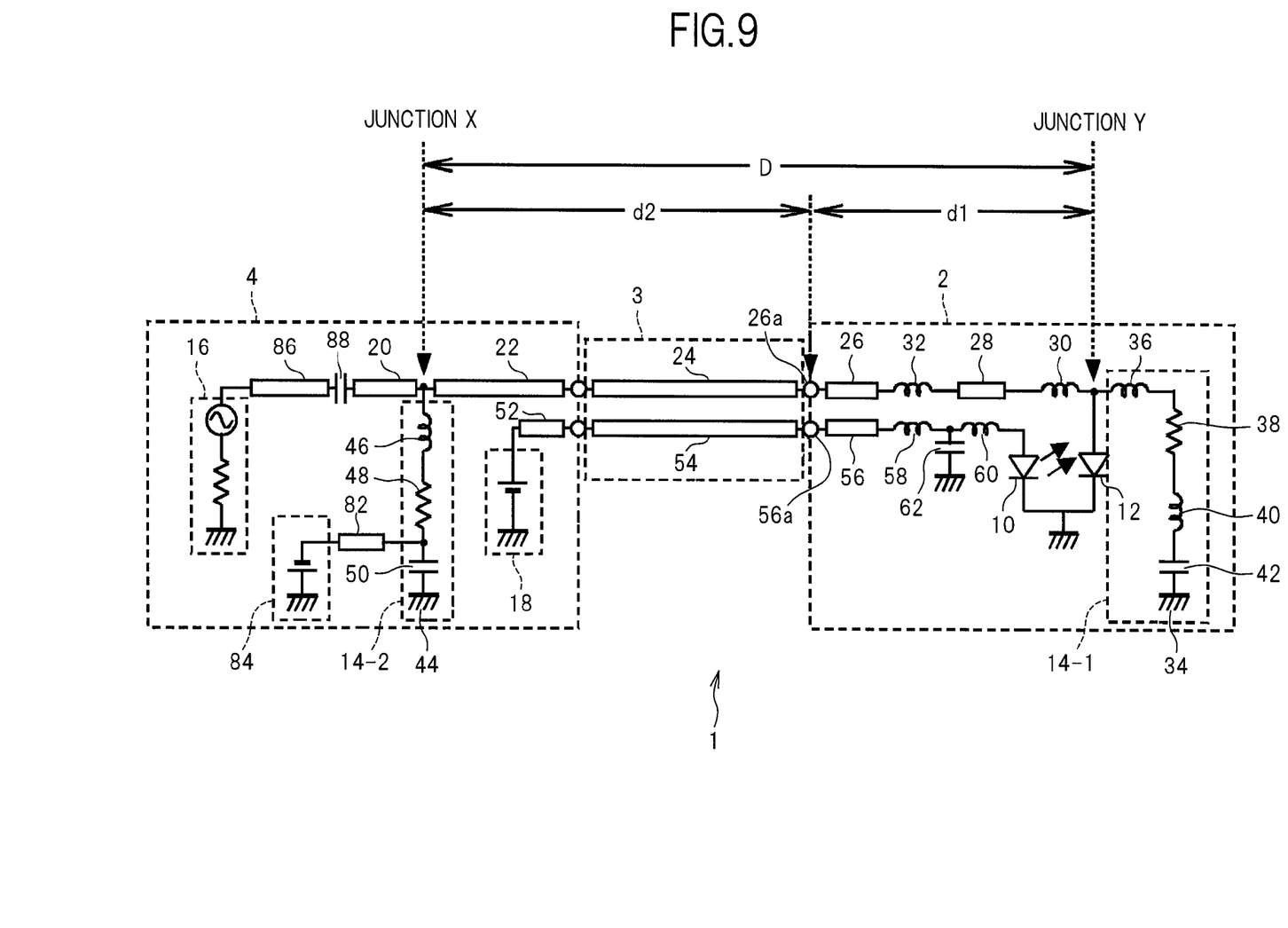
FIG. 9 is a diagram illustrating an example of major circuits in an optical transmitter device according to another embodiment of the present invention.
Figure 10:
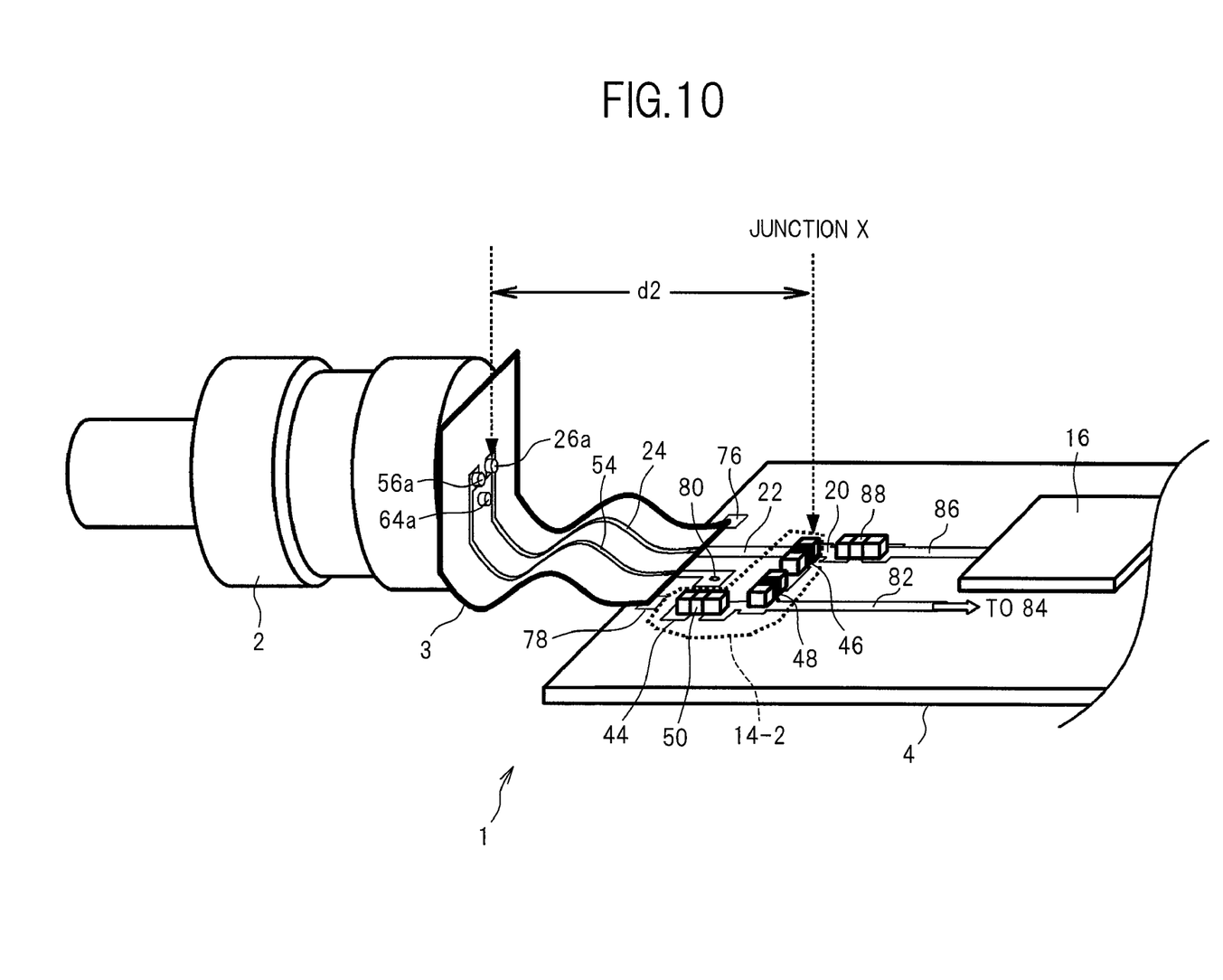
FIG. 10 is a diagram illustrating an example of major parts of the optical transmitter device according to the another embodiment of the present invention.

FIG. 9 is a diagram illustrating an example of major circuits in the optical transmitter device 1 according to another embodiment. FIG. 10 is a diagram illustrating an example of major parts of the optical transmitter device 1 according to this embodiment.

In the second termination resistor circuit 14-2 of this embodiment, the inductor device 46, the resistor device 48, and the capacitor device 50 are connected in series in the stated order from the junction X where the second termination resistor circuit 14-2 connects with the transmission line, toward the ground electrode 44, and a branching point is provided at the junction between the resistor device 48 and the capacitor device 50 to connect a bias voltage supply circuit 84 through a transmission line 82 beyond the branching point. The bias voltage supply circuit 84 supplies a bias voltage to the optical modulator device. The inductor device 46, the resistor device 48, and the capacitor device 50 in FIGS. 9 and 10 have the same electrical characteristics and part forms as those of the inductor device 46, the resistor device 48, and the capacitor device 50 in the above-mentioned embodiment. The characteristic impedance of the transmission line 22, the transmission line 24, and a transmission line 86 is 50 Ohms. A capacitor device 88 is a DC blocking capacitor and, for example, a 1005-size multi-layered ceramic capacitor having a capacitance value of 0.1 microfarads. With the circuit structure of this embodiment, the second termination resistor circuit 14-2 can double as a favorable low-pass filter for a DC voltage supply path from the bias voltage supply circuit 84 to the junction X where the second termination resistor circuit 14-2 connects with the transmission line. This enables the optical transmitter device 1 to use as the driver IC 16 an IC of the type that does not have a function of supplying a bias voltage. According to this embodiment, an IC that is smaller in size and more inexpensive can thus be used for the optical transmitter device 1, and thus is effective in reducing the size and cost of the optical transmitter device 1.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmitter device, comprising:
an optical transmitter module; and
a printed circuit board which is electrically connected to the optical transmitter module,
wherein the optical transmitter module comprises:
  a light emitting device;
  an optical modulator configured to modulate light emitted from the light emitting device; and
  a first termination resistor circuit which is electrically connected to the optical modulator,
wherein the printed circuit board comprises:
  a signal output circuit configured to output a signal supplied to the optical modulator; and
  a second termination resistor circuit which is electrically connected to the signal output circuit,
wherein the first termination resistor circuit comprises a first resistor device, a resistance value of which is Rterm, and a first capacitor device, a capacitance value of which is Cterm;
wherein the second termination resistor circuit comprises a second resistor device, and an inductor device, an inductance value of which is Lterm; and
wherein a relational expression $(Rterm)^2 * Cterm \times 2/3 <= Lterm <= (Rterm)^2 \times Cterm * 3/2$ is satisfied, and wherein an impedance of the first termination resistor circuit in a pass frequency band thereof is substantially equal to an impedance of the second termination resistor circuit in a pass frequency band thereof.

2. The optical transmitter device according to claim 1, further comprising a transmission line that electrically connects the optical transmitter module and the printed circuit board,
wherein the impedance of the first termination resistor circuit in the pass frequency band thereof corresponds to a characteristic impedance of the transmission line, and
wherein the impedance of the second termination resistor circuit in the pass frequency band thereof corresponds to the characteristic impedance of the transmission line.

3. The optical transmitter device according to claim 1, wherein a signal output from the signal output circuit has a given value or less as a difference between an amplitude at a junction where the first termination resistor circuit connects with the transmission line and an amplitude at a junction where the second termination resistor circuit connects with the transmission line.

4. The optical transmitter device according to claim 3, wherein a ratio of a difference in the amplitude of the signal between the junction where the first termination resistor circuit connects with the transmission line and the junction where the second termination resistor circuit connects with the transmission line, to the amplitude of the signal output from the signal output circuit is set to 5% or less.

5. The optical transmitter device according to claim 3, wherein a time constant that corresponds to the lower cutoff frequency of the first termination resistor circuit is equal to or larger than a value obtained by multiplying a delay time of the transmission line by a given number.

6. The optical transmitter device according to claim 3, wherein a product of a capacitance value of the capacitor device
and a resistance value of the resistor device is equal to or larger than a value obtained by multiplying a delay time of the transmission line by a given number.

7. An optical transmitter module which is electrically connected to a printed circuit board,
the optical transmitter module comprising:
  a light emitting device;
  an optical modulator configured to modulate light emitted from the light emitting device; and
  a first termination resistor circuit which is electrically connected to the optical modulator,
wherein the printed circuit board comprises:
  a signal output circuit configured to output a signal supplied to the optical modulator; and
  a second termination resistor circuit which is electrically connected to the signal output circuit,
wherein the first termination resistor circuit comprises a first resistor device, a resistance value of which is Rterm, and a first capacitor device, a capacitance value of which is Cterm;
wherein the second termination resistor circuit comprises a second resistor device, and an inductor device, an inductance value of which is Lterm; and
wherein a relational expression $(Rterm)^2 \times Cterm \times 2/3 <= Lterm <= (Rterm)^2 \times Cterm \times 3/2$ is satisfied, and wherein an impedance of the first termination resistor circuit in a pass frequency band thereof is substantially equal to an impedance of the second termination resistor circuit in a pass frequency band thereof.

* * * * *